(12) United States Patent
Bret et al.

(10) Patent No.: US 7,670,956 B2
(45) Date of Patent: Mar. 2, 2010

(54) BEAM-INDUCED ETCHING

(75) Inventors: Tristan Bret, Lausanne (CH); Patrik Hoffmann, Epalinges (CH); Michel Rossi, Cossonay (CH); Xavier Multone, Monthey (CH)

(73) Assignee: FEI Company, Hillsboro, OR (US)

( * ) Notice: Subject to any disclaimer, the term of this patent is extended or adjusted under 35 U.S.C. 154(b) by 1069 days.

(21) Appl. No.: 11/102,602

(22) Filed: Apr. 8, 2005

(65) Prior Publication Data
US 2006/0228634 A1    Oct. 12, 2006

(51) Int. Cl.
H01L 21/302    (2006.01)

(52) U.S. Cl. .................... 438/709; 438/706; 438/708; 216/66

(58) Field of Classification Search ............. 438/706, 438/708, 709, 725, 742, 5, 358; 216/65, 216/66, 75; 430/5, 358
See application file for complete search history.

(56) References Cited

U.S. PATENT DOCUMENTS

| | | | |
|---|---|---|---|
| 4,004,043 A | 1/1977 | Hiraoka | |
| 4,639,301 A | 1/1987 | Doherty et al. | |
| 4,961,200 A * | 10/1990 | Verdier et al. | 372/89 |
| 5,055,696 A | 10/1991 | Haraichi et al. | |
| 5,104,684 A | 4/1992 | Tao et al. | |
| 5,149,974 A | 9/1992 | Kirch et al. | |
| 5,376,234 A | 12/1994 | Yanagida | |
| 5,419,809 A | 5/1995 | Nagayama et al. | |
| 5,435,850 A | 7/1995 | Rasmussen | |
| 5,445,712 A * | 8/1995 | Yanagida | 438/695 |
| 5,490,869 A * | 2/1996 | D'Obrenan et al. | 75/10.14 |
| 5,807,650 A * | 9/1998 | Komano et al. | 430/5 |
| 5,851,413 A | 12/1998 | Casella et al. | |
| 6,042,738 A | 3/2000 | Casey, Jr. et al. | |
| 6,159,641 A | 12/2000 | Baum et al. | |
| 6,368,753 B1 | 4/2002 | Harriot et al. | |
| 6,440,615 B1 | 8/2002 | Shimizu | |
| 6,709,554 B2 | 3/2004 | Ferranti et al. | |
| 6,753,538 B2 | 6/2004 | Musil et al. | |
| 2003/0000921 A1 | 1/2003 | Liang et al. | |
| 2004/0048398 A1 | 3/2004 | Liang et al. | |

(Continued)

OTHER PUBLICATIONS

I. Chyr and A. J. Steckl, "GaN Focused Ion Beam Micromachining with Gas-Assisted Etching," J. Vac. Sci. Technol, B. 19(6), Nov./Dec. 2001, 2001 American Vaccum Society, pp. 2547-2550.

(Continued)

*Primary Examiner*—Lan Vinh
(74) *Attorney, Agent, or Firm*—Meyertons, Hood, Kivlin, Kowert & Goetzel, P.C.; Eric B. Meyertons

(57) ABSTRACT

A method and apparatus for local beam processing using a beam activated gas to etch material are described. Compounds are disclosed that are suitable for beam-induced etching. The invention is particularly suitable for electron beam induced etching of chromium materials on lithography masks. In one embodiment, a polar compound, such as $ClNO_2$ gas, is activated by the electron beam to selectively etch a chromium material on a quartz substrate. By using an electron beam in place of an ion beam, many problems associated with ion beam mask repair, such as staining and riverbedding, are eliminated. Endpoint detection is not critical because the electron beam and gas will not etch significantly the substrate.

21 Claims, 3 Drawing Sheets

U.S. PATENT DOCUMENTS

2005/0193747 A1* 9/2005 Kajimoto et al. .............. 62/133

OTHER PUBLICATIONS

M. A. Kalceff and M. R. Phillips, "Electron irradiation induced outgrowths from quartz," J. Appl. Phys. B. 77 (8) Apr. 15, 1995, 1995 American Institute of Physics, pp. 4125-4127.

Dieter Winkler, Hans Zimmermann, Margot Mangerich and Robert Trauner, "E-Beam Probe Station with Integrated Tool for Electron Beam Induced Etching," Elsevier Science B.V., MicroElectronic Engineering 31, (1996) pp. 141-147.

Shinji Matsui, Toshinari Ichihashi, and Masanobu Mito, "Electron Beam Induced Selective Etching and Deposition Technology," J. Vac. Sci. Technol. B 7 (5) Sep./Oct. 1989, 1989 American Vacuum Society, pp. 1182-1190.

Shinji Matsui, Toshinari Ichihashi, Masakazu Baba and Akinobu Satoh, "Electron Beam Induced Selective Etching and Deposition Technology," 1990 Academic Press Limited, Superlattices and Microstructures, vol. 7, No. 4, (1990) pp. 295-301.

H. Fujioka, K. Nakamae, M. Hirota, K. Ura, N. Tamura and T. Takagi, "Rapid Communication Measurements of the Energy Dependence of Electron Beam Assisted Etching of, and Depostition on, Silica," 1990 IOP Publishing Ltd., pp. 266-268.

K. T. Kohlmann-Von Platen and W. H. Bruenger, "Electron-Beam Induced Etching of Resist with Water Vapor as the Etching Medium," J. Vac. Sci. Technol. B 14 (6), Nov./Dec. 1996, 1996 American Vacuum Society, pp. 4262-4266.

D. Winkler, H. Zimmermann, O. Gessner, M. Sturm, and H. Formanek, "Electron-Beam Induced Etching (EBE) Integrated Into an E-Beam Probe Station," Proceedings of the 20th International Symposium for Testing and Failure Analysis, Nov. 13-18, 1994, pp. 19-22.

Shinji Matsui, and Katsumi Mori, "Direct Writing onto Si by Electron Beam Stimulated Etching," Appl. Phys. Lett. 51 (19), Nov. 9, 1987, 1987 American Institute of Physics, pp. 1498-1499.

* cited by examiner

BEAM-INDUCED ETCHING

TECHNICAL FIELD OF THE INVENTION

The present invention relates to the field of localized beam-induced etching and, in particular, to a method and apparatus for using a beam to create or alter microscopic structures.

BACKGROUND

Photolithography processes are widely used in the fabrication of integrated circuits. In a typical photolithography process, a thin layer of a photoactive material called "photoresist" is deposited onto the surface of a semiconductor substrate, such as a silicon wafer. The photoresist can be composed of any of a number of different materials whose chemical structure changes when exposed to a certain type of radiation. This change in chemical structure can cause the photoresist to become more soluble, in the case of a positive photoresist, or less soluble, in the case of a negative photoresist, in a chemical solution referred to as a developer.

A photolithography mask in the shape of a desired circuit pattern is used as a template to transfer the circuit pattern to the surface of the semiconductor substrate. A typical transmission mask has a pattern of clear and opaque areas, repeated over its surface, that is used to fabricate a layer of a circuit. The mask, when positioned between an appropriate radiation source and the photoresist-coated semiconductor substrate, casts a shadow onto the photoresist and thus controls which areas of the photoresist are exposed to the radiation. On other types of masks reflect light, a reflective pattern reflects light toward the semiconductor substrate.

After exposure, the photoresist is removed from either the exposed or the unexposed areas by washing with an appropriate developer. This leaves a patterned layer of photoresist on the wafer that protects parts of the wafer during a subsequent process step, such as etching, deposition, or diffusion. After the subsequent process step is completed, the remaining photoresist is removed. This photolithography process ultimately allows the actual circuitry to be integrated into a semiconductor chip.

Obviously, the mask is a key element in this process since it is the mask that determines the circuit pattern that is transferred to the semiconductor substrate. A typical mask comprises a patterned layer of an opaque absorber material, such as a metallic film of chromium or tungsten, on a substrate of a transparent material, such as quartz. Features on a mask can be as small as a few millionths of an inch. When the pattern is formed on the mask, typically by using computer controlled laser or electron beam systems to expose the desired mask pattern in a photoresist material, it is not unusual for the mask to have defects. There are essentially two defect types, opaque and clear. Clear defects are areas where absorber is missing from areas that should be opaque; opaque defects are areas having absorber material deposited in areas that should be clear. Since any defect in the mask will ultimately be transferred to any semiconductor chip manufactured using that mask, these defects must be repaired before the mask can be used.

Traditionally, focused ion beam systems (FIB) have been used to repair defects in photolithography masks. A finely focused beam of gallium ions from a liquid metal ion source is scanned across the mask surface to form an image of surface. The intensity at each point of the image is determined by the current of secondary electrons ejected by the ion beam at the corresponding point on the substrate. The defect is identified on the image, and the ion beam is then scanned over the defect area in order to remove the excess absorber material from a mask surface or to deposit missing absorber material.

When used to remove material, the heavy gallium ions in the focused ion beam physically eject atoms or molecules from mask surface by sputtering, that is, by a transfer of momentum from the incoming ions to the atoms at the surface. The momentum transfer mechanism is considered to function through a series of collisions with nuclei in the substrate lattice, the process being referred to as a "collision cascade."

When a FIB is used to deposit material to repair a clear defect, a gas is directed toward the defect area, and material is deposited by using an ion beam to decompose gas molecules absorbed on the substrate surface. A process for depositing a metal material using a FIB is described, for example, in U.S. Pat. No. 5,104,684 to Tao entitled "Ion Beam Induced Deposition of Metals."

There are several problems with the use of gallium ion FIB systems to repair masks, particularly when used to repair opaque defects. First, gallium ions become implanted into the substrate surrounding the defect area. This phenomenon, commonly referred to as "staining," causes the stained substrate to lose some of its transparency. This loss of transparency, in turn, introduces defects in the mask image that is transferred to the semiconductor substrate. The loss of transparency is particularly severe for the very short exposing light wavelengths used in modern photolithography processes, with the loss of transparency typically being between three and ten percent.

Second, the sputtering process of the focused ion beam is relatively unselective. While an opaque defect is being removed by the ion beam, substrate material at the edge of the defect is also attacked, and the result is a trench of damaged substrate material around the defect. This type of substrate damage is known as "riverbedding" because the etched edges resemble riverbeds when viewed with an electron microscope. Riverbedding results in an altered intensity and phase for the light traversing the quartz surrounding the defect.

Third, the sputtering of material by the ion beam leads to ejection of material in all directions, and some of this ejected material comes to rest on adjacent surfaces. This effect, known as redeposition, limits the precision of the microstructure fabrication.

Lastly, because the mask substrate is typically made of an insulating material, a positive electrical charge tends to accumulate on isolated defects when they are bombarded by the positive gallium ions. Each positively charged gallium ion not only brings a positive charge to the area, each massive ion also ejects multiple electrons from the surface. As this positive charge accumulates, it will reduce the emission of secondary electrons by which an image of the defect is attained. Ion beam systems used for mask repair typically include a charge neutralizer, such as an electron flood gun as described in U.S. Pat. No. 4,639,301 to Doherty, et al. for "Focused Ion Beam Processing." It can be difficult to adjust the flood gun to just neutralize the surface charge, especially as the surface composition under bombardment is changing as the absorber material is removed.

Sputtering by an FIB system can be further enhanced, and some of the previously described problems can be minimized, by using an etching gas that adsorbs onto the surface and reacts to form volatile compounds with the surface atoms under impact of the ion beam. The surface atoms are then more readily removed and less likely to redeposit. The gas atoms react with the surface molecules when energy is provided by the incoming ions. The incoming ions do not significantly react directly with the adsorbed gas molecules. The ions typically react in a series of collisions with atoms in the substrate, the collisions providing energy back through the lattice to knock atoms from the surface and instigate chemical reactions with the adsorbed gas molecules. Some gases cause the ion beam to preferentially etch one material over another. Although the use of a gas can reduce the enumerated problems associated with gallium-based FIB systems, the problems still remain.

Some materials are known to be etched by an etchant chemical in the presence of an electron beam. Electrons cannot sputter material because the momentum of an electron in a typical electron beam is not sufficient to remove molecules from a surface by momentum transfer. The amount of momentum that is transferred during a collision between an impinging particle and a substrate particle depends not only upon the momentum of the impinging particle, but also upon the relative masses of the two particles. Maximum momentum is transferred when the two particles have the same mass. When there is a mismatch between the mass of the impinging particle and that of the substrate particle, less of the momentum of the impinging particle is transferred to the substrate particle. A gallium ion used in focused ion beam milling has a mass of over 130,000 times that of an electron. In a typical focused ion beam system, the gallium ions are accelerated through a voltage of 25-50 kV, whereas the electrons in a transmission electron microscope are typically accelerated through a voltage of 100 kV. The momentum transfer of a typical 30 kV gallium ion impinging on a copper substrate in a FIB system is therefore greater than 20,000 times that of a 100 kV electron in an electron microscope.

Chemically induced etching using an electron beam therefore occurs through a different mechanism than the mechanism of ion beam sputtering. An electron beam will not etch in the absence of a chemical etchant, whereas an ion beam will always sputter material, even though sputtering may be enhanced or attenuated by a gas. Thus, an electron beam cannot be used to etch a particular material unless a chemical is found that will etch the material in the presence of the electron beam, but will not significantly etch the material in the absence of electron beam.

Several etchants are known for use with electron beams. Matsui et al. in "Electron Beam Induced Selective Etching and Deposition Technology," *Journal of Vacuum Science and Technology B*, Vol. 7, No. 5 (1989) describes electron beam induced etching of silicon, gallium arsenide, and polymethylmethacrylate using xenon difluoride, chlorine, and $ClF_3$. Matsui et al. also describe the deposition of tungsten using tungsten hexafluoride in the presence of an electron beam. Winkler et al. in "E-Beam Probe Station With Integrated Tool For Electron Beam Induced Etching," *Microelectronic Engineering* 31, pp. 141-147 (1996) describes electron beam induced etching of insulation layers, such as $SiO_2$, $Si_3N_4$, and polyimide on integrated circuits. U.S. Pat. No. 6,753,538 to Musil et al. for "Electron Beam Processing" teaches the use of an electron beam to etch a film containing tantalum and tungsten. U.S. Pat. App. Pub No. 2003/0000921 of Liang et al. for "Mask Repair with Electron Beam-Induced Chemical Etching" describes etching tantalum nitride using $XeF_2$, $CF_4$, or $F_2$ and etching chrome compounds using $Cl_2$ and $O_2$. U.S. Pat. No. 5,055,696 to Hirachi et al. for "Multilayered Device Micro Etching Method and System" describes locally etching material using a reactive gas or a focused ion beam using a variety of etchant gases. Hirachi et al. mentions that an electron beam or a laser could be used in place of the ion beam, but it fails to describe which etchants will etch in absence of ion beam sputtering and his detailed description of end-pointing is indicative of ion beam, not electron beam, processing.

The etchants described above do not etch certain material, such as chromium materials, used on photolithograph masks with the desired speed and selectivity.

SUMMARY OF THE INVENTION

An object of the invention, therefore, is to locally etch certain material using a beam-induced reaction to create or alter microscopic structures, such as to repair photolithography masks.

In accordance with one aspect of the invention, a beam, such as an electron beam, is directed toward the material to be processed, along with a gas that etches the material in the presence of the beam. The invention is particularly useful in the repair of photolithography masks but is also useful for processing material on any type of work piece.

The subject matter of the present invention is particularly pointed out and distinctly claimed in the concluding portion of this specification. However, both the organization and method of operation, together with further advantages and objects thereof, may best be understood by reference to the following description taken in connection with accompanying drawings wherein like reference characters refer to like elements.

BRIEF DESCRIPTION OF THE DRAWINGS

For a more complete understanding of the present invention, and the advantages thereof, reference is now made to the following descriptions taken in conjunction with the accompanying drawings, in which.

DETAILED DESCRIPTION OF PREFERRED EMBODIMENTS

Figure 1:
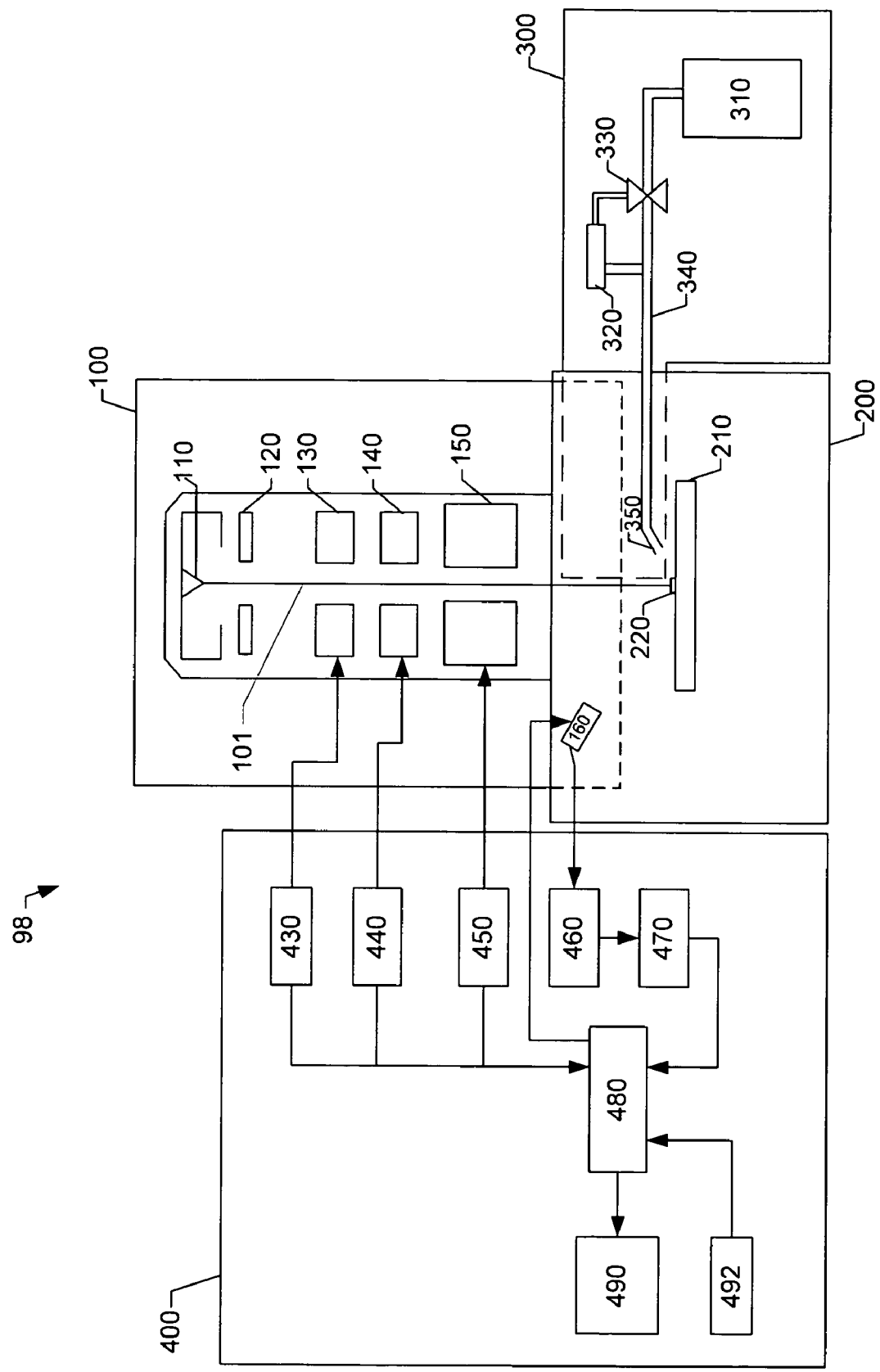
FIG. 1 shows schematically a typical electron beam system used in a preferred embodiment of the invention.

The present invention provides methods for locally removing material using a beam. The invention provides etchants that are useful for selectively etching certain materials in the presence of an activating beam, such as a charged particle beam or a laser beam. Some embodiments are particularly useful for etching chromium materials and can be used for electron beam-induced etching.

"Chromium material" as used herein includes any material containing chromium, such as the metallic chromium, partially oxidized chromium and partially nitrided chromium. Such chromium materials are commonly used as absorbing layers in photolithography masks. The invention is therefore particularly useful for photolithography mask repair. The invention can be used as part of a serial process, in which a single beam performs operations one after another, or in a parallel process, in which multiple beams operate simultaneously on one or more work pieces, either on the same or on different areas of the one or more work pieces. The invention can use a scanned beam, or a beam, such as a shaped beam, that covers a large area and that does not require scanning. The invention is useful for the repair of opaque defects, and in particular is useful for removing extra material, such as protrusions and undesired pinspots, which may be unintentionally produced during mask fabrication.

The method involves the use of a focused, shaped or broad beam, together with an appropriate gaseous reactant. While the use of electron beam etching for mask repair is known, applicants provide new etchants for etching chromium materials and other materials. High-resolution inspection and repair are made possible by the small beam sizes and their use as activation sources for the etching process at the nanometer level. Etch selectivity between the absorbing layer and the substrate is achieved by careful choice of the reacting gas.

While the inventive etchants can also be used with lasers or focused ion beams, use of an electron beam with the etchants provides advantages in mask repair. Electron beam-induced etching can repair certain opaque mask defects on a chrome absorber mask without the staining, riverbedding, and redeposition caused by gallium-based FIB systems and at a higher resolution than typical laser systems. The electron beam is directed toward the defect area in the presence of a gas that etches the surface in the presence of the electron beam. As the electron beam is directed to the area, the excess material is removed by a chemical reaction induced by the electron beam. The invention can be similarly be used to etch materials on any type of work piece.

Etchant Gases Suitable for Etching Chrome Using an Electron Beam

The following information illustrates, how a suitable etchant gas is selected for electron-beam induced etching of chromium material. The information is provided as an example, and the invention is not limited to electron beam induced etching of chromium materials.

A preferred reactant gas has one or more of the following properties:

1) The ability of the gas molecules to be decomposed by the electron beam into fragments that form volatile Cr compounds. A volatile chemical element is one that is gaseous in its thermodynamically standard state. For example, some chromium halogenides are known to be volatile. Chromium fluoride ($CrF_5$) and chromyl chloride ($CrO_2Cl_2$), for instance, both boil at 117° C., while chromium chloride ($CrCl_4$) is a gas at room temperature.

2) The ability of the gas molecules to be adsorbed onto the work piece surface, that is, the gas's adsorption efficiency. The residence time, that is, the time that the gas molecule remains on the surface, directly influences the efficiency of the etching process. The residence time depends exponentially on the energy of adsorption of the compounds at the surface, being higher for molecules having larger adsorption energies. The adsorption energy in turn, is given by the Van der Waals interactions between a molecule and a surface. These interactions decrease in the following order: ionic compounds>polar compounds>non-polar compounds.

Typical residence times at room temperature vary between a few picoseconds, for an adsorption energy of about 4 kcal/mol (which is the case, for example, for $O_2$, CO, or noble gases), to a few milliseconds, for adsorption energies from about 10 kcal/mol to about 15 kcal/mol (which range is typical of the adsorption energies of many organic substances). Many gaseous compound having a first atom of a halogen and at least one second atom different from the first atom are suitable for etching many materials because such compounds typically have adsorption energies and residence times greater than those of pure halogen gases, such as $Cl_2$. Gas compounds for beam-activated etching preferably has an adsorption energy greater than about 6 kcal/mol, more preferably greater than 8 kcal/mol, and most preferably greater than 10 kcal/mol or greater than 12 kcal/mol.

Larger etch rates are attainable with polar molecules, which typically exhibit higher van der Waals forces. Table 1 below shows examples of dipole moments for a few sample compounds.

TABLE 1

| Compound | Dipole Moment (Debye) |
|---|---|
| $ClNO_2$ | 0.53 |
| ClNO | 1.28 |
| $ClO_2$ | 1.78 |
| $Cl_2$ | 0.0 |
| $O_2$ | 0.0 |

The permanent dipole moments of $ClNO_2$, ClNO, and $ClO_2$, as shown above, are large compared to that of $Cl_2$ and $O_2$, which are zero. A preferred compound for use with the present invention includes a dipole moment greater than 0.4 debye and more preferably greater than 0.5 debye. Considering the elementary event of electron-beam-induced etching, the use of a polar compound allows delivery to the reaction site of a stable molecule that sticks for a much longer time than a non-polar molecule and that delivers a reactive agent (in this case, an excited Cl atom) when dissociated by the electron beam. If using a mixture of $Cl_2$ and $O_2$, the residence times of both molecules are considerably smaller than that of the polar molecules $ClNO_2$ or ClNO and other compound molecules describe herein. $Cl_2$ and $O_2$ do not spontaneously combine to form polar compounds, even on a Cr surface. Hence, the etching rates of a mixture of $Cl_2$ and $O_2$ is considerably smaller than the etching rates of polar compounds, although the reactive agents should be similar.

3) The ability of the gas molecules to selectively etch chrome compared to the quartz ($SiO_2$) substrate. Chlorine-containing gases are preferred, firstly because silicon chlorides are less volatile than silicon fluorides. For example, $SiF_4$ and $SiCl_4$ boil at −86° C. and 58° C., respectively, so a chlorine compound will etch the silicon containing quartz substrate at a lower rate than the fluorine compound. Secondly, the selectivity is due to thermodynamics. The standard heats of formation of $SiF_4$, $SiO_2$ and $SiCl_4$ are −1615, −911 and −657 kJ/mol, respectively. Hence, the formation of gaseous $SiF_4$ from $SiO_2$ is favored because it is exothermic, while the formation of $SiCl_4$ is strongly hindered because this reaction needs energy. In other words, $SiCl_4$ is less stable than $SiO_2$, so the chlorine chemistry allows the etch selectivity between chromium and quartz, which is impossible with fluorine chemistry.

The selectivities of some etching compounds are enhanced by the formation of a passivation layer that inhibits etching of an underlying material. For example, the nitrogen in $ClNO_2$ or ClNO combines with the $SiO_2$ at the interface, and creates on the quartz surface a $SiN_xO_y$ material, which is not attacked by the released chlorine, thereby improving the selectivity of etching chrome over quartz.

4) The ability of the gas to not form opaque or other contaminating non-volatile elements, such as carbon, phosphorus, or sulfur, under decomposition by the electron beam. If the gas formed opaque or other contaminating non-volatile elements, those elements would form a solid deposit on the mask under the electron beam decomposition.

Desirable compounds typically include several of the properties described above, but not every property is required in all applications. For example, some Cl—O compounds described herein, such as $ClO_2$, lack nitrogen and may not form a passivation layer, but have a dipole moment that provides a sufficient residence time on the surface to promote an efficient reaction.

All polar chlorine compounds with volatile elements, such as hydrogen, helium, neon, argon, bromine, krypton, iodine, xenon, nitrogen or oxygen, that have boiling points in the −200° C. to +600° C. temperature range, or that can be pumped under vacuum in this temperature range, can be used as a reactant gas. Applicants have found that gaseous compounds corresponding to the stoichiometry $Cl_xN_yO_zH_t$ (with x, y, z, t integers) are likely to be suitable. This includes but is not restricted to the following list of compounds:

ClNO (nitrosyl chloride), $ClNO_2$ (nitryl chloride), $ClONO_2$ (chlorine nitrate), HCl (Hydrogen chloride), $Cl_2O$ (chlorine monoxide), $ClO_2$ (chlorine dioxide), $Cl_2O_2$, $Cl_2O_4$ (chlorine perchlorate), $Cl_2O_6$ (chlorine hexoxide), $Cl_2O_7$ (chlorine heptoxide), ClO, ClOH, $NCl_3$ (nitrogen trichloride), and $NH_2Cl$ (chloramine).

Not only chlorine, but also fluorine-, bromine-, and iodine-containing analogs of the above compounds are thought to be suitable. Suitable compounds also include the inter-halogen compounds $F_wCl_xBr_yI_zN_rO_sH_r$ (with w, x, y, z, t, s, r integers), among which for instance $ClOF_3$, $ClO_2F$, ICl, $ICl_3$, IBr, and BrCl.

In accordance with one embodiment of the invention, molecules of an electron beam-activated gaseous compound are adsorbed onto the surface of a mask in an electron beam system. The gaseous compound causes chromium material, such as metallic chromium or a chromium compound such as a chromium oxide or chromium nitride, on the surface of the mask to be selectively etched in the presence of the electron beam. The selective etching allows the removal of the chromium material while minimally affecting the quartz substrate. Because the etching is primarily chemical in nature and does not rely on physical sputtering, it is highly selective and causes none of the repair-induced damage that typically accompanies FIB etching. Unlike FIB mask repair processes, using an electron beam does not introduce any foreign atoms into the substrate and so avoids staining.

FIG. 1 depicts one embodiment of an electron beam system 98 used in a preferred embodiment of the invention. The electron beam system depicted in FIG. 1 includes an electron beam column 100, a specimen vacuum chamber 200, a reactant material delivery system 300, and a user control station 400.

An electron beam 101 is emitted from a cathode 110 by applying voltage between cathode 110 and an anode 120. Electron beam 101 is focused to a fine spot by means of a condensing lens 130 controlled by a condensing lens control circuit 430 and an objective lens 150 controlled by an objective lens control circuit 450. Electron beam 101 is scanned two-dimensionally on the specimen by means of a deflection coil 140 controlled by a deflection control circuit 440. Operation of condensing lens control circuit 430, objective lens control circuit 450, and deflection coil control circuit 440 is controlled by the control unit 480.

Electron beam 101 is focused onto a work piece 220, such as a photolithography mask having a metallic film absorber material patterned on a substrate. Work piece 220 is located on a movable stage 210 within the specimen vacuum chamber 200. The specimen vacuum chamber 200 includes a secondary electron detector 160 for detecting secondary particles suitable for generating an image of the work piece. The operation of secondary electron detector 160 is controlled by the control unit 480. Secondary electron detector 160 is also connected to an amplifier 460. The amplified signals are converted into digital signals and subjected to signal processing by the signal processor unit 470. The resulting digital signal is used by control unit 480, such as a CPU, in coordination with signals from deflection control 440 and to display an image of work piece 220 on the monitor 490.

Control unit 480 coordinates deflection control 440 with the image displayed on monitor 490 so that, for example, an operator can use an input device 492 to indicate on monitor 490 an area over which to scan the beam. Control unit 480 can then cause deflection control unit 480 to apply appropriate voltages to deflection coil 140 to scan the beam in accordance with operator input. Control unit 480 can also automatically or semi-automatically interpret input from secondary electron detector 160 to differentiate between types of materials on the surface of work piece 220 and can then determine an area to be scanned and direct deflection control unit 480 to scan the determined area.

The depicted reactant material delivery system 300 includes a reservoir 310 connected to a delivery conduit 340 that has a distal portion formed as a nozzle for delivering reactant materials to the surface of work piece 220. The depicted reactant delivery system 300 includes a manometer 320 coupled to delivery conduit 340 for measuring the delivery pressure within delivery conduit 340 of any reactant materials being delivered to the surface of work piece 220. Manometer 320 further couples to the motorized valve element 330. Motorized valve element 330 is selectively controllable for increasing or reducing the flow of reactant materials of reservoir 310 through delivery conduit 340. The arrangement of manometer 320 and motorized valve element 330 depicted in FIG. 1 forms a feedback control system, wherein manometer 320 measures the delivery pressure within delivery conduit 340 and selectively controls motorized valve element 330 to increase or decrease the flow of reactant material to thereby maintain a selected delivery pressure.

A preferred type of gas delivery system is described in more detail in U.S. Pat. No. 5,149,974 to Kirch et al. for "Gas Delivery for Ion Beam Deposition and Etching." Other gas delivery systems, such as those described in U.S. Pat. No. 5,851,413 to Casella et al. for "Gas Delivery Systems For Particle Beam Processing" or in U.S. Pat. No. 5,435,850 to Rasmussen for a "Gas Injection System," can be used. Any type of gas delivery system can be used if it delivers an appropriate amount of the etchant gas to the work piece surface while maintaining an adequate vacuum for the electron beam. For example, the etchant supply may be located inside or outside the vacuum chamber.

Figure 2:
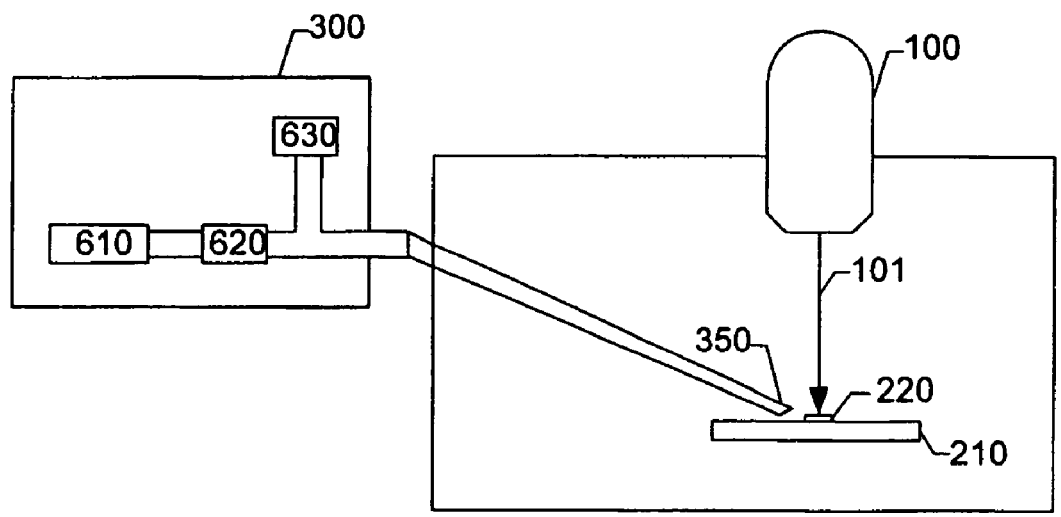
FIG. 2 is a schematic of one embodiment of a gas delivery system for use with the electron beam system of FIG. 1
Figure 4:
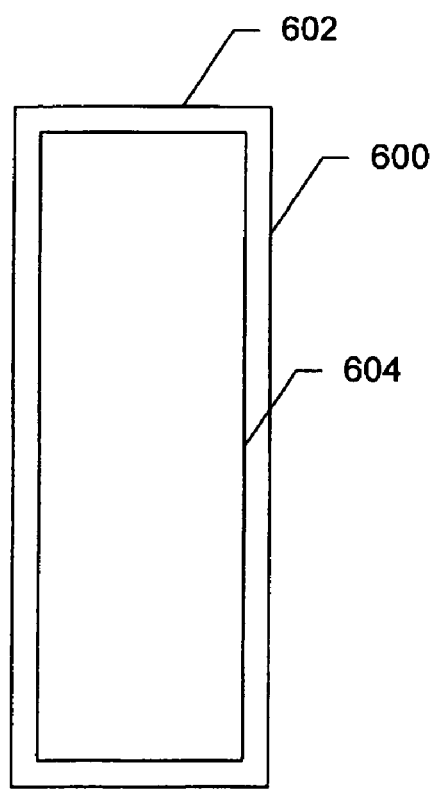
FIG. 4 shows an example of a scan strategy for electron beam processing.

A preferred embodiment of the reactant material delivery system 300 is depicted in FIG. 2. This embodiment includes nozzle 350 for delivering an etchant 610, such as $ClNO_2$, in selected proximity to the work piece. Etchant flow rates are controlled by a feedback loop between a motorized variable orifice 620 and a pressure transducer 630.

Nozzle 350 is located in selected proximity to the target point where electron beam 101 interacts with the surface of the work piece. Multiple nozzles could also be used to deliver additional etching gases or component of an etching gas. A preferred range for the distance between target point and nozzle tip is 50 to 600 microns in the X-Y plane and 50 to 400 microns in the Z direction. Preferably, the inner diameter of the opening at the end of nozzle 350 is about 0.5 mm.

As an alternative to system 100, the invention could be implemented in a low vacuum scanning electron microscope, such as the ESEM® environmental scanning electron microscope from FEI Company. In an environmental scanning electron microscope, the work piece is maintained in an environment having a higher pressure, up to about 10 Torr, and the secondary particles are amplified by the cascade ionization of the gas in the sample chamber. The etchant gas can be combined with an imaging gas, to maintain a higher concentration of the etchant gas at the work piece surface.

Figure 3:
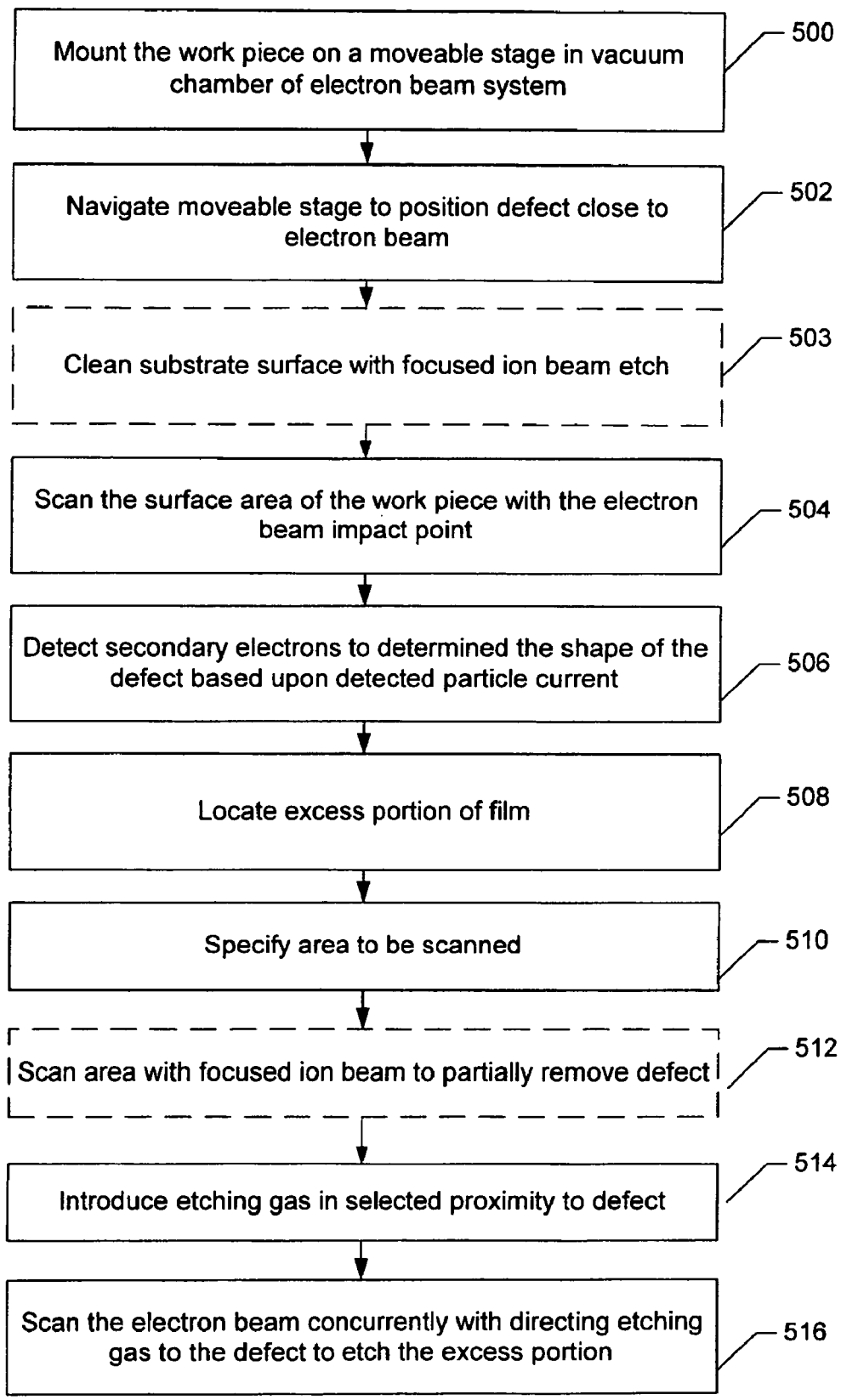
FIG. 3 is a flow chart showing a preferred method of the present invention.

FIG. 3 is a flow chart showing the steps of a preferred embodiment of the present invention. In step 500, work piece 220, typically a photolithography mask, is mounted on moveable stage 210 in the vacuum chamber of an electron beam system, such as system 98 of FIG. 1. Any type of electron beam system that is capable of performing the steps described below can be used. It is advantageous to employ a system which features a high brightness field emission gun and digital beam scanning with precise control over the lateral distance and temporal interval between successive placements of the beam, and which is capable of operating at a low electron beam landing energy (about 500 eV to about 5 keV) and under relatively poor vacuum (about $10^{-4}$ mbar). A suitable electron beam system would be, for example, an electron beam system similar to one configured to function as a scanning electron microscope.

In a preferred embodiment, moveable stage 210 can be moved in the X and Y coordinates so that the desired area of the work piece 220 can be positioned under electron beam 101. Work piece 220 typically comprises a substrate composed of a transparent material, such as quartz, having on its surface a patterned metallic film, such as a film of a chromium material. The vacuum within the vacuum chamber will be approximately $1 \times 10^{-7}$ Torr before the introduction of the etchant gas.

In step 502, moveable stage 210 is navigated to the approximate coordinates of a defect, that is, the defect is approximately aligned with the electron beam at zero deflection. The defect will typically have been previously located by automatic inspection equipment that supplies the coordinates of the defect to controller 480 of electron beam system 98.

In optional step 503, the substrate surface is pre-cleaned by FIB sputtering with or without the presence of an etching gas. This FIB etching serves to clean the surface of the substrate and to remove any oxide layer that may reduce the effectiveness of the electron beam induced etching in steps 514 and 516. In many embodiments, the pre-cleaning step is unnecessary, and the heavy ions implanted during the optional pre-cleaning step may actually impair subsequent electron beam etching.

In step 504, the surface area of work piece 220 is scanned by the electron beam functioning as a scanning electron microscope. The electrons preferably have a landing energy of between approximately 500 eV and approximately 5 keV. In step 506, the secondary electrons emitted by the scanning primary electron beam are detected by secondary electron detector 160 as electron beam 101 scans in step 504. The shape of the defect is then determined based upon detected electron intensities and displayed on monitor 490.

In step 508, the excess material defect is located. In step 510, an operator typically identifies the defect on monitor 490, for example, by drawing a polygon around the defect area. The designated area to be scanned is often referred to as a "box." The defect may also be located and identified automatically. Although direct exposure of the quartz substrate should be avoided because slow electron-beam-induced damage is possible with some compounds, the entire area within the polygon may be scanned by the electron beam. The scan can also be limited to the actual defect area, as determined by the contrast in image intensity between the defect and non-defect area.

In optional step 512, a focused ion beam can optionally be used to remove a portion of the excess material defect, leaving preferably approximately 20-40 nm of material to be removed with the electron beam in step 514 and 516. The focused ion beam can be used with any of the halogen based etchant gasses described above, with another etchant gas, or without an etchant gas. By removing most of the defect layer using the focused ion beam, the defect is removed more quickly because the etch rate of the ion beam is typically greater than that of the electron beam. The gallium atoms from the focused ion beam typically implant in the target to a depth of between 20-40 nm. By leaving approximately that thickness of material unetched by the ion beam and then using the electron beam to remove the remaining material, little or no gallium will be implanted into the mask itself. If step 512 is used, step 503 is not necessary, and a step of locating the defect area to be scanned is performed before the ion beam is scanned. Separate steps for imaging and drawing a repair box may be needed for the ion beam and electron beam because the beams may not be perfectly aligned. In some instances, the implantation of ions from the ion beam in step 512 has a detrimental effect on the subsequent electron beam etching, and step 512 may be undesirable.

In step 514, an etching gas is introduced in proximity to and directed toward the excess material defect. Examples of suitable gases are described above. Preferably, the base pressure for the vacuum is on the order of $10^{-6}$ Torr or less. The maximum flow rate from the gas nozzle is preferably limited by the allowable gas pressure rise in the specimen chamber. Thus, the flow rate should be limited to that value which does not raise the base pressure for the vacuum substantially above $10^{-4}$ mbar.

In step 516, concurrently with the introduction of the etching gas in step 514, the electron beam removes the defect by repeatedly scanning the material to be removed in the presence of the etching gas. The motion of the electron beam is adjusted to maximize the etching rate. The motion of electron beam can be characterized by a dwell time, that is, the time the beam stays at each point, by the pixel spacing, that is, the distance between successive points, and by a refresh period, that is, the time it takes for the electron beam to return to each dwell point.

The dwell time is adjusted so that the electron beam dwells at each point just long enough for the chemical reaction induced by the electron beam to exhaust the etchant gas adhered to the surface. The refresh period is adjusted to be sufficiently long to allow sufficient etchant gas to adhere to the surface for activation by the electron beam. Skilled persons can determine an approximate dwell time and refresh rate without undue experimentation by varying each until etching is maximized at a particular gas flow. In some embodiments, a broad beam or shaped beam can be positioned over the material to be removed, and the etchant gas is replenished while the beam dwells on the area to be removed without scanning. The invention is not limited to any beam configuration. For example, one can use a narrow scanning beam, such as the beam typically used in a scanning electron microscope having a beam width of less then 0.1 μm, or a broad or shaped beam, such as the beam shape used in a transmission electron microscope, which can encompass the entire defect area without scanning and can have a beam width of more than a millimeter. One could also step a shaped beam to stitch shapes together, or overlap shapes to produce structures.

Electron landing energies of between about 0.5 keV and about 10 keV are preferred, with energies between 1 keV and 3 keV being most preferred. In general, the efficiency of the removal rate increases with decreasing landing energy until the energy at which a maximum in secondary electron yield is attained. This increase in removal rate must be balanced by a concurrent increase in beam size and consequent loss in lateral resolution when the landing energy is reduced. The preferable beam scanning parameters are dependent upon the spot size and the current density of the electron beam and the flux of the etchant gas over the area of electron irradiation. In general, the amount of electron charge that is required in order to remove a given excess material defect may be minimized by adjusting the pixel spacing to be commensurate with the beam size, by setting the dwell time to match the ratio of the saturated density of the adsorbed etchant gas on the surface to the flux of the electrons, and by fixing the refresh time to be equivalent to the time it takes to adsorb a monolayer of the etchant gas onto the surface. Because of the selectivity of the etchant, the spot size can be relatively large without damaging the surrounding substrate.

In one embodiment, focused-electron-beam induced selective etching of a 90 nm thick Chromium mask on quartz was performed using $ClNO_2$, with a gas flux of about 200 $mg/cm^2 \cdot s$ using an injection syringe having a diameter of 0.5 mm. The chamber pressure was about $10^{-4}$ mbar, and the sample was at room temperature. A primary electron beam accelerating voltage of 3 keV was used. The beam from a heated tungsten filament was focused to a spot size of 10 μm (full width half maximum). A beam current of 50 nA was applied for about 60 minutes etch through 90 nm of chromium, with the sample at room temperature.

Optical microscopy confirmed that a hole was formed in the Cr film, demonstrating the process efficiency. Electron-Dispersive X-Ray Analysis revealed a composition $SiO_2$ in the hole, proving that the substrate was reached. Atomic Force Microscopy revealed that the Cr-quartz interface was flat, demonstrating the process selectivity. Further irradiating the quartz substrate had no effect, and even a slow quartz etching could not be observed. Scanning Electron Microscopy reveals that the hole edges are sharp, demonstrating a high-resolution surface process.

Skilled persons will understand that the optimum electron beam parameters will vary with the material being etched and the etchant gas being used. Skilled persons will be able to determine optimum parameters without undue experimentation by monitoring and maximizing the removal rate, similar to the manner used in focused ion beam systems to maximize etching.

A suitable system for carrying out the invention is an FEI Company Model 83S Dual Beam (ion beam and electron beam) system. The electron beam was produced by the scanning electron microscope of the dual beam system. The parameters to be adjusted on the system are the same as those described above and include the beam energy, the beam current, the dwell time, the dwell point spacing (that is, the beam overlay from dwell point to dwell point), the refresh rate, and the etchant gas flow rate or pressure.

It is believed that the gas is adsorbed onto the surface of the exposed layers of the work piece and the electron bombardment provides energy to initiate a reaction of the adsorbed gas molecule with the surface material to be etched. The reaction produces volatile products that dissipate thereby etching or removing material from the surface of the work piece.

The etch rate is thought to vary for different materials because the strength of the etch reaction may vary with different materials, the sticking coefficient of the gas may be different for different materials, and the reaction products may be different and have different degrees of volatility. Some gases may inhibit the etching of some materials by producing reaction product that is not volatile and that forms a protective film over the second layer. Although a theoretical basis of the mechanism of the invention is described to provide a more complete understanding, the invention has been shown to work regardless of the accuracy of the proposed mechanism.

An electron beam system of the present invention can be mounted in the same vacuum chamber as a focused ion beam or can be an independent system. The system can include other accessories, such as other types of surface characterization instruments, including x-ray or Auger electron spectrometers, that can be used to characterize the etch products. Such system can be used to detect when the defect material has been completely removed. In many embodiments, end point detection is not critical because the electron beam will not significantly etch the substrate or will etch the underlying material at significantly slower rate, even in the presence of the etchant gas. Using some of the gases described above for etching chromium materials, the etch process is selective to the opaque material and continuing to direct the electron beam to the substrate in the presence of the gas will not result in overetching or create any flaw in the photolithography mask.

The term "gaseous compound" as used herein a chemical compound that is in a gaseous state. The gaseous compound can be diluted by other gases, such as by an inactive carrier gas, to facilitate directing the gaseous compounds toward the work piece. In different embodiments, multiple ones of the gaseous compounds described above as etchant gases can be used together, or the gases could be used with other gases to enhance the reaction. While compounds are preferred, certain mixtures that include a halogen containing gas and a nitrogen containing gas may also be suitable. Such mixtures include, for example a mixture of $Cl_2$ and $NO_2$.

Although the embodiment described above is used for mask repair, the invention is not limited to any particular work piece. For example, the invention can be used for removing chromium materials, other metallic materials and compounds, or other materials, in a micro-electromechanical system or in patterning a substrate, such as for making a lithography mask.

While the embodiment described above uses an electron beam, the inventive etchants can also be used with an ion beam or a laser. While ion beams have some disadvantages in repair of quartz masks, in some other applications ion beam may be preferable to ion beams, particularly where transparency of the substrate is not required. As describe above, an ion beam may be used to initially thin a material, with an electron beam used to remove the remaining material. The etchants are also useful for some materials other than chrome.

The invention has multiple aspects and advantages making it suitable for a wide variety of applications. Not all aspects of the invention need to be present in every embodiment.

Although the present invention and its advantages have been described in detail, it should be understood that various changes, substitutions, and alterations can be made to the embodiments described herein without departing from the spirit and scope of the invention as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

We claim as follow:

1. A method of repairing a photolithograph mask including excess chromium material on a quartz substrate, comprising:
   directing an electron beam toward the excess chromium material on the quartz substrate;
   directing a gas toward the excess chromium material, the gas including a gaseous compound including XNO, $XNO_2$, or $XONO_2$ in which X is a halogen, the gaseous compound reacting in the presence of the electron beam to etch the excess chromium material while not significantly etching the quartz substrate.

2. The method of claim 1 in which directing an electron beam toward the excess chromium material on a substrate includes directing an electron beam toward a metallic chromium, an chromium oxygen compound, or a chromium nitrogen compound.

3. The method of claim 1 in which directing an electron beam toward the excess chromium material on a substrate includes directing an electron beam toward the chromium material on a quartz substrate, the chromium material etching at a rate at least twice as great as the rate at which the quartz substrate is etched.

4. The method of claim 1 in which the gaseous compound has a dipole moment greater than about 0.4 debye.

5. The method of claim 1 in which the molecules of the gaseous compound have an adsorption energy on the quartz substrate of greater than about 8 kcal/mol.

6. The method of claim 1, wherein X is a chlorine atom.

7. The method of claim 1 in which directing a gaseous compound toward the excess chromium material includes directing a gaseous compound including HCl.

8. The method of claim I in which directing a gaseous compound toward the chromium material, includes directing a compound of the form $F_wCl_xBr_yI_zN_tO_sH_r$, in which w, x, y, z, t, s, and r integers, at least two of w, x, y, and z are greater than zero, and at least t and s are also greater than zero, the gaseous compound reacting in the presence of the electron beam to etch the chromium material.

9. The method of claim 1 in which directing a gaseous compound toward the excess chromium material includes directing a gaseous compound of the form $ClNO_x$.

10. The method of claim 9 in which directing a gaseous compound toward the excess chromium material includes directing a gaseous compound having the form $ClNO_2$ or ClNO.

11. The method of claim 1 in which directing a gaseous compound toward the excess chromium material includes directing a compound of the form $X_rN_sO_tH_u$, in which X is a halogen; r, s, t, and u are integers; and r, s, t, and u are greater than zero.

12. The method of claim 11 in which X is chlorine.

13. The method of claim 11 in which X is fluorine, bromine or iodine.

14. A method of beam-induced selective etching of a material on a substrate, comprising:
   directing the beam toward the material on a substrate;
   directing a gaseous compound toward the chromium material to be removed, the gaseous compound including XNO, $XNO_2$, or $XONO_2$, in which X is a halogen, or including $ClNO_x$, the gaseous compound reacting in the presence of the electron beam to etch the material.

15. The method of claim 14 in which X is chlorine.

16. The method of claim 14 in which the gaseous compound has a dipole moment greater than about 0.4 debye.

17. The method of claim 14 in which the material is a chromium material.

18. The method of claim 14 in which directing the beam toward the material on a substrate includes directing a focused ion beam toward the substrate.

19. The method of claim 14 in which directing the beam toward the material on a substrate includes directing a laser beam toward the substrate.

20. The method of claim 14 in which directing the beam toward the material on a substrate includes directing a focused ion beam toward a excess chromium material on a transparent photolithography substrate.

21. A method of repairing a photolithograph mask including excess chromium material on a quartz substrate, comprising:
   directing an electron beam toward the excess chromium material on the quartz substrate;
   directing a gas toward the excess chromium material, the gas including a gaseous compound including $ClNO_x$, the gaseous compound reacting in the presence of the electron beam to etch the excess chromium material while not significantly etching the quartz substrate.

* * * * *

UNITED STATES PATENT AND TRADEMARK OFFICE
CERTIFICATE OF CORRECTION

PATENT NO. : 7,670,956 B2
APPLICATION NO. : 11/102602
DATED : March 2, 2010
INVENTOR(S) : Bret et al.

Page 1 of 1

It is certified that error appears in the above-identified patent and that said Letters Patent is hereby corrected as shown below:

Claim 8, col. 13, line 37, please delete "claim I" and substitute therefor -- claim 1 --.

Signed and Sealed this

Twenty-seventh Day of April, 2010

David J. Kappos
*Director of the United States Patent and Trademark Office*